US006975151B2

(12) United States Patent
Akiyoshi

(10) Patent No.: US 6,975,151 B2
(45) Date of Patent: Dec. 13, 2005

(54) LATCH CIRCUIT HAVING REDUCED INPUT/OUTPUT LOAD MEMORY AND SEMICONDUCTOR CHIP

(75) Inventor: Hideo Akiyoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/056,072

(22) Filed: Mar. 26, 2002

(65) Prior Publication Data

US 2004/0076041 A1 Apr. 22, 2004

Related U.S. Application Data

(63) Continuation of application No. 09/610,982, filed on Jul. 6, 2000, now abandoned.

(30) Foreign Application Priority Data

Jul. 6, 1999 (JP) ................................ 11-192375

(51) Int. Cl.[7] ........................ H03K 3/307; H03K 3/356

(52) U.S. Cl. ...................... 327/199; 327/211; 327/212; 327/213

(58) Field of Search .................... 326/93, 94; 327/199, 327/200, 201, 202, 211, 210, 212, 213

(56) References Cited

U.S. PATENT DOCUMENTS 4,390,970 A 6/1983 Kay ............................ 365/73
4,835,422 A 5/1989 Dike et al. .................... 326/94
5,173,626 A * 12/1992 Kudou et al. ............... 327/211
5,257,223 A 10/1993 Dervisoglu ............ 365/189.05
5,281,865 A 1/1994 Yamashita et al. .......... 327/202
5,550,489 A 8/1996 Raab .......................... 326/93

* cited by examiner

*Primary Examiner*—Trong Phan

(74) *Attorney, Agent, or Firm*—Staas & Halsey LLP

(57) ABSTRACT

A latch circuit to perform high-speed input and output operations by reducing a load of an input circuit or an output circuit of the latch circuit. The latch circuit includes four or more inverters connected in a loop to hold a signal, a plurality of input terminals respectively connected to different nodes, and a plurality of output terminals respectively connected to different nodes. At least one input terminal of the latch circuit is used for normal operation of the latch circuit, and at least one input terminal is used for a test operation of the latch circuit. Further, at least one output terminal of the latch circuit is used for normal operation of the latch circuit, and at least one output terminal is used for a test operation of the latch circuit. The latch circuit reduces the number of circuit elements at a connecting point of an input terminal of the latch circuit or at a connecting point of an output terminal of the latch circuit. By reducing the number of circuit elements at the input or output connections, a load of the input or output can be reduced, and thereby high-speed input or output can be realized.

11 Claims, 8 Drawing Sheets

LATCH CIRCUIT HAVING REDUCED INPUT/OUTPUT LOAD MEMORY AND SEMICONDUCTOR CHIP

CROSS-REFERENCE TO RELATED APPLICATIONS

This application is based upon and claims priority of Japanese patent application no. 11-192375, filed Jul. 6, 1999, and is a continuation of U.S. patent application Ser. No. 09/610,982, filed Jul. 6, 2000 abandoned, the contents being incorporated herein by reference.

BACKGROUND OF THE INVENTION

1. Field of the Invention

The present invention relates to a semiconductor integrated circuit. More particularly, the present invention relates to a latch circuit which reduces the number of circuit elements connected to an input or an output to reduce load at the input or output to thereby achieve high-speed operation.

2. Description of the Related Art

A latch circuit has the function of temporarily holding (i.e., storing) signals. FIGS. 1–3 illustrate examples of related art latch circuits. As shown in FIGS. 1–3, to hold signals the related art latch circuits include a loop circuit, which is formed of two stages of inverters to hold signals. A latch circuit may be connected with a plurality of input circuits and output circuits. In such a latch circuit, the number of terminals respectively connected to input circuit and output circuits has increased.

The related art latch circuits shown in FIGS. 1–3 respectively include a plurality of input circuits and output circuits connected thereto.

The example of the related art latch circuit shown in FIG. 1 includes an input node N1, and an output node N2. Two input circuits (not shown) are connected at the input node N1, which is the input of the latch circuit. Specifically, an input I1 from a first input circuit and an input I2 from a second input circuit are connected at the input node N1. Moreover, two output circuits (not shown) are connected by the output node N2, which is the output of the latch circuit. Specifically, an output O1 to a first output circuit and an output O2 to a second output circuit are connected at the output node N2.

The example of the related art latch circuit shown in FIG. 2 includes two input nodes N1 and N2, and two output nodes N3 and N4. In a manner similar to the latch circuit shown in FIG. 1, two input circuits (not shown) are connected to the latch circuit shown in FIG. 2. Specifically, an input I1 from a first input circuit is connected at the node N1, while an input I2 from a second input circuit is connected at the node N2. Moreover, in a manner similar to FIG. 1, two output circuits (not shown) are connected to the latch circuit. Specifically, an output O1 to a first output circuit is connected at the node N3, while an output O2 to a second output circuit is connected at the node N4.

The example of the related art latch circuit shown in FIG. 3 includes two input nodes N1 and N2, and two output nodes N3 and N4. Similar to the latch circuit shown in FIG. 1, the latch circuit shown in FIG. 3 is connected with two input circuits. Specifically, an input I1 and an input /I1 from a first input circuit are respectively connected to the node N1 and the node N2, while an input I2 from a second input circuit is connected at the node N1.

Moreover, similar to the latch circuit shown in FIG. 1, two output circuits (not shown) are connected to the latch circuit of FIG. 3. Specifically, an output O1 and an output /O1 to a first output circuit are respectively connected at the node N3 and the node N4, and an output O2 to the second output circuit is connected at the node N2.

The inputs I1 and /I1 and output O1 are used for the normal operation, and the input I2 and output O2 are used for a test operation. High-speed input and output are required for the inputs I1 and /I1 and the output O1, while the high-speed input and output are not required for the input I2 and output O2.

As shown in FIG. 1, the inputs I1 and I2 of the latch circuit, an input of a first inverter 1 and an output of a second inverter 2 are connected at the input node N1. The input I1 requires a high-speed input. However, because the other three circuit elements connected at the node N1 become a large load, the latch circuit cannot assure the high-speed input for the input I1.

As shown in FIG. 2, the input I1 of the latch circuit, the output of the first inverter 1, the input of the second inverter 2 and the input of the third inverter 3 are connected at the input node N1. The input I1 requires high-speed input. However, because the other three circuit elements connected at the node N1 become a large load, the latch circuit cannot assure the high-speed input for the input I1.

As shown in FIG. 3, the inputs I1 and I2 of the latch circuit, the output of the first inverter 1, the input of the second inverter 2 and the input of the third inverter 3 are connected at the input node N1. The input I1 requires high-speed input. However, because the other four circuit elements connected at the node N1 become a large load, the latch circuit cannot assure the high speed input for the input I1.

Moreover, as shown in FIG. 3, an input /I1, which is the complement signal of the first input I1 of the latch circuit, the output O2 of the latch circuit, the output of the second inverter 2, the input of the first inverter 1 and the input of the fourth inverter 4 are connected at the node N2. The input /I1 requires a high-speed input. However, because the other four circuit elements connected at the node N2 become a large load, the latch circuit cannot assure the high-speed input for the input /I1.

SUMMARY OF THE INVENTION

It is an object of the present invention to provide a latch circuit to hold signals, the latch circuit including four or more inverters forming a loop to hold the signals.

It is an object of the present invention to provide a latch circuit having a reduced load applied to an input and output of the latch circuit.

It is another object of the present invention to provide a latch circuit which achieves high-speed input and output by reducing the number of circuit elements connected to a connecting point of an input or to a connecting point of an output which require high-speed operations.

Objects and advantages of the present invention are achieved in accordance with embodiments of the present invention with a latch circuit for holding signals, the latch circuit comprising four or more inverters connected in a loop to hold a signal. The latch circuit may further comprise a plurality of input terminals respectively connected to different nodes. The latch circuit, may further comprise a plurality of output terminals respectively connected to different nodes. The latch circuit may further comprise a plurality of input terminals and output terminals respectively connected to different nodes.

In accordance with embodiments of the present invention, at least one input terminal of the latch circuit is used for normal operation of the latch circuit, and at least one input terminal is used for a test operation of the latch circuit.

In accordance with embodiments of the present invention, at least one output terminal is used for normal operation of the latch circuit, and at least one output terminal is used for a test operation of the latch circuit.

In accordance with embodiments of the present invention, complementary signals are supplied to at least one pair of input terminals of the latch circuit.

In accordance with embodiments of the present invention, the latch circuit comprises four inverters connected in a loop.

In accordance with embodiments of the present invention, the latch circuit comprises six inverters connected in a loop.

Objects and advantages of the present invention are achieved in accordance with embodiments of the present invention with a latch circuit, comprising a plurality of input terminals and a plurality of output terminals, wherein the plurality of input terminals and the plurality of output terminals are respectively connected at different nodes, and at most three circuit elements are connected at the different nodes.

Objects and advantages of the present invention are achieved in accordance with embodiments of the present invention with a latch circuit comprising a plurality of input terminals and a plurality of output terminals, wherein complementary input signals are supplied to at least one pair of input terminals, and wherein a plurality of input terminals and a plurality of output terminals are respectively connected at different nodes, and four or fewer circuit elements are respectively connected at the different nodes.

Objects and advantages of the present invention are achieved in accordance with embodiments of the present invention with a memory, comprising a latch circuit to hold a signal, the latch circuit comprising four or more inverters connected in a loop to hold the signal.

Objects and advantages of the present invention are achieved in accordance with embodiments of the present invention with a semiconductor chip design system to design a latch circuit, comprising a unit cell library in which a latch circuit comprising four or more inverters connected in a loop to hold a signal is registered; and a macro cell library in which a macro using the latch circuit is registered.

In accordance with the present invention, the semiconductor chip design system generates an RTL description based on design specifications of the latch circuit, and generates a net list for the latch circuit based on the RTL description, using any one of the unit cell library and macro cell library.

In accordance with the present invention, the semiconductor chip design system generates layout design data for the latch circuit based on the net list, using any one of the unit cell library and the macro cell library.

In accordance with the present invention, the semiconductor chip design system generates mask layout data for the latch circuit based on the layout data, using any one of the unit cell library and the macro cell library.

In accordance with embodiments of the present invention, the number of circuit elements at a connecting point of an input terminal of the latch circuit or at a connecting point of an output terminal of the latch circuit is reduced. By reducing the number of circuit elements at the input or output connections, a load of the input or output can be reduced, and thereby high-speed input or output can be realized.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DESCRIPTION OF THE PREFERRED EMBODIMENTS

Figure 1:
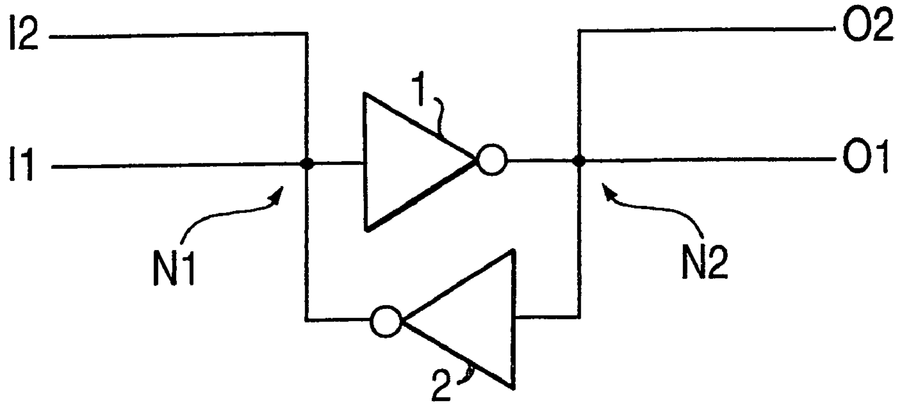
FIG. 1 is a circuit diagram illustrating a related art latch circuit.
Figure 2:
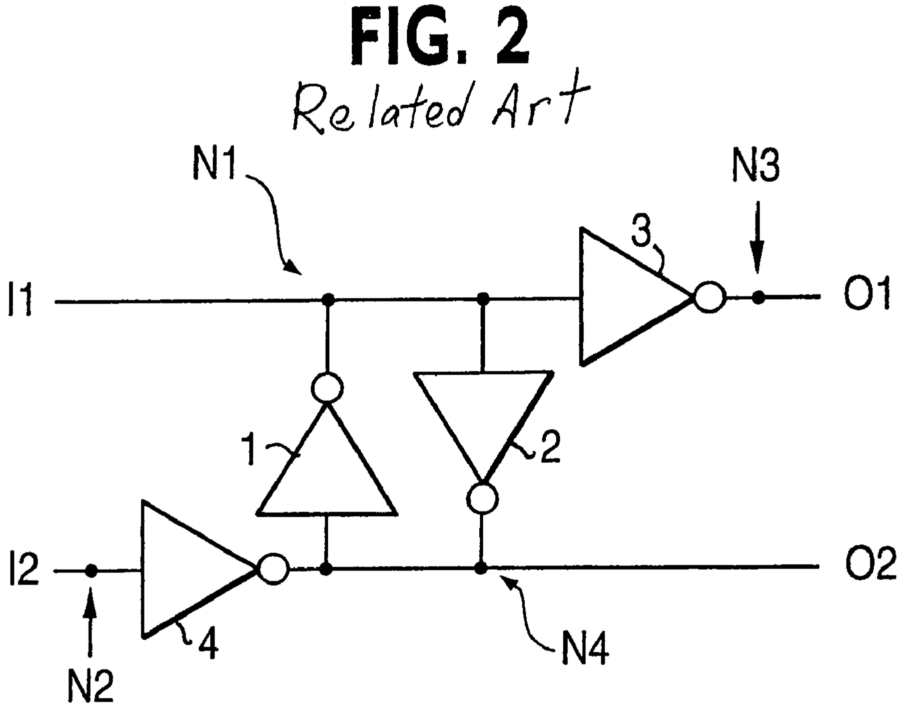
FIG. 2 is a circuit diagram illustrating a related art latch circuit.
Figure 3:
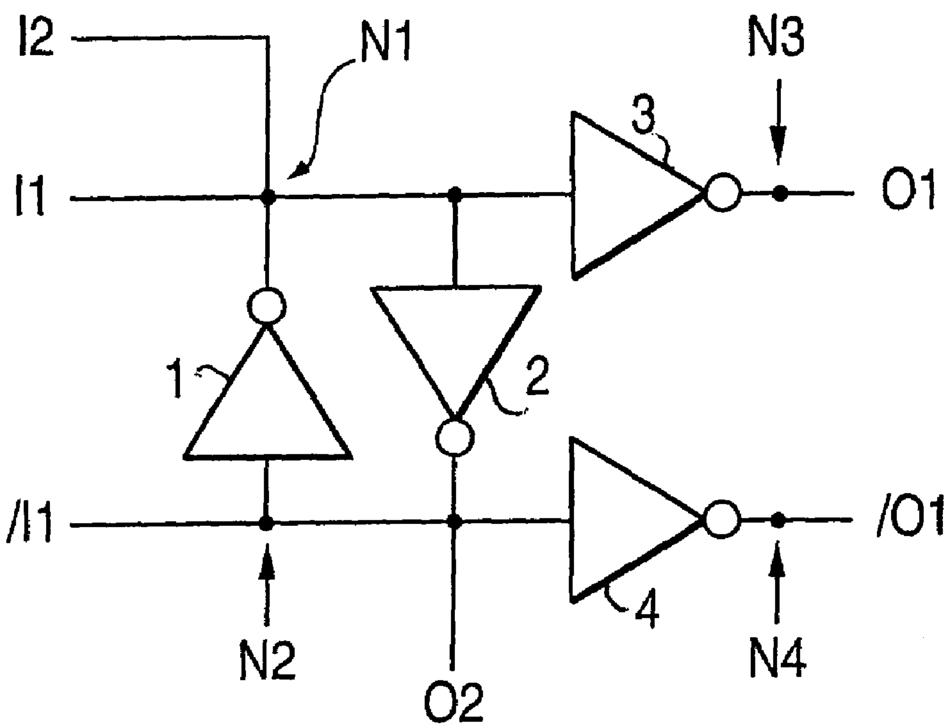
FIG. 3 is a circuit diagram illustrating a related art latch circuit.

Reference will now be made in detail to the preferred embodiments of the present invention, examples of which are illustrated in the accompanying drawings, wherein like reference numerals refer to like elements throughout.

Figure 4A:
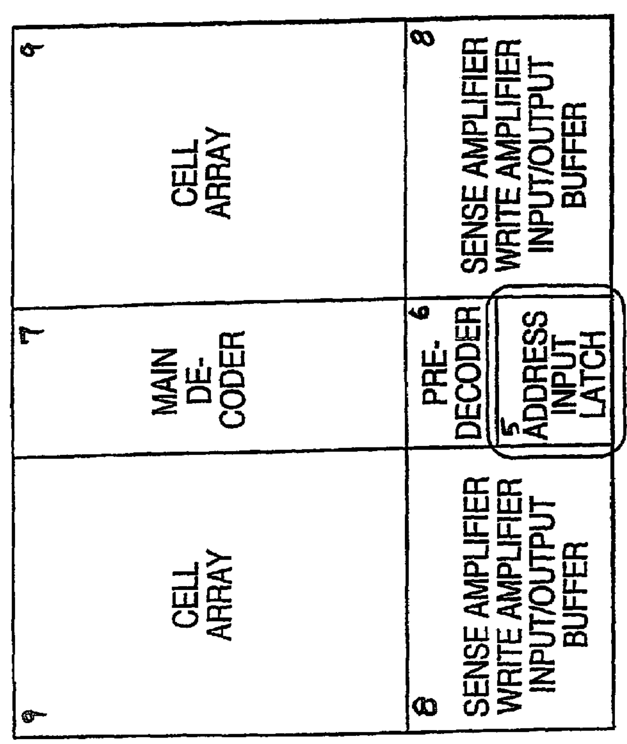
FIG. 4A is a block diagram of an SRAM in accordance with embodiments of the present invention.

FIG. 4A is a block diagram of a static random access memory (SRAM) in which a latch circuit in accordance with embodiments of the present invention is incorporated. As shown in FIG. 4A, an address input latch for an inputting an address is arranged in an area 5 of the SRAM, a predecoder for predecoding the address is arranged in an area 6, a main decoder for decoding the address is arranged in an area 7, an input/output buffer for inputting and outputting data, a sense amplifier and a write amplifier for amplifying data are arranged in the area 8, and a cell array for storing data is arranged in an area 9.

The latch circuit in accordance with preferred embodiments of the present invention, can be applied to an address input latch arranged in the area 5 shown in FIG. 4A.

Figure 4B:
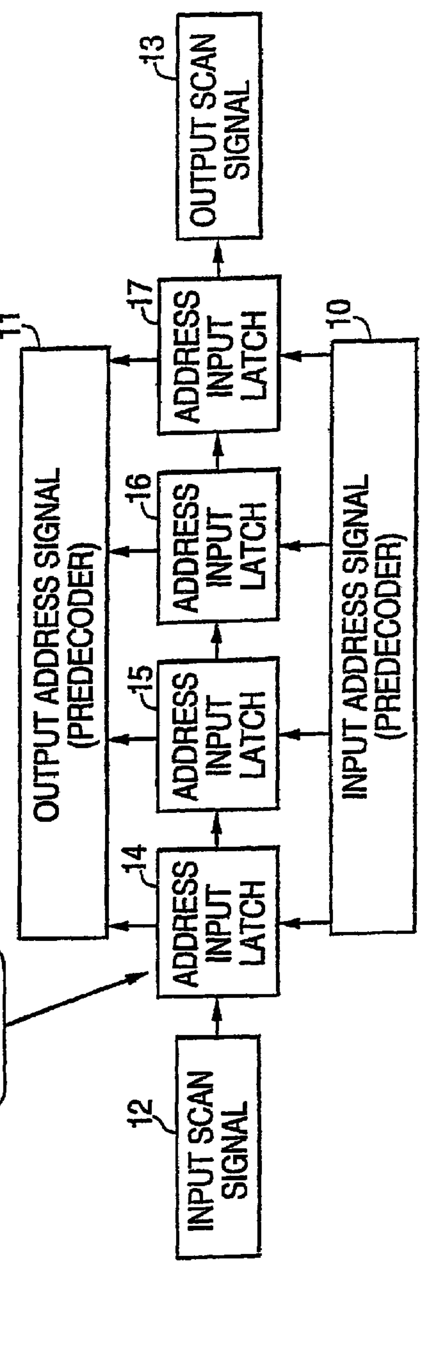
FIG. 4B is a block diagram of an address input latch used in the SRAM in accordance with embodiments of the present invention.

FIG. 4B is a block diagram of the address input latch in accordance with embodiments of the present invention. As shown in FIG. 41B, since an address is formed of four bits, address input latches 14, 15, 16 and 17 are connected in four stages. The number of address input latches is set depending on the bit format of an address.

An input address signal 10 is supplied to the respective address input latches 14–17. An address output signal 11 is output by the respective address input latches 14–17. During normal operation of the SRAM, the input address signal 10 is input and the output address signal 11 is output.

Moreover, an input scan signal 12 is supplied to the address input latch 14, and the input scan signal 12 is output as the output scan signal 13 from the address input latch 17 via the address input latch 15 and address input latch 16. During a test operation of the SRAM, the input scan signal 12 is input and the output scan signal 13 is output to verify operation of the address input latch.

As described above, in accordance with preferred embodiments of the present invention, an input address signal 10 and an input scan signal 12 are input to respective address latch circuits 14–17, and an output address signal 11 and an output scan signal 13 are output from respective latch circuits. However, the present invention is not limited to one address signal, and can be adapted to a latch circuit to which a plurality of input signals are supplied and from which a plurality of output signals are output.

In accordance with the present invention, the SRAM is only an example of the type of memory to which the present invention is applicable. However, the present invention is not limited to an SRAM, and can also be applied to the other memory circuits, such as DRAM.

Figure 5:
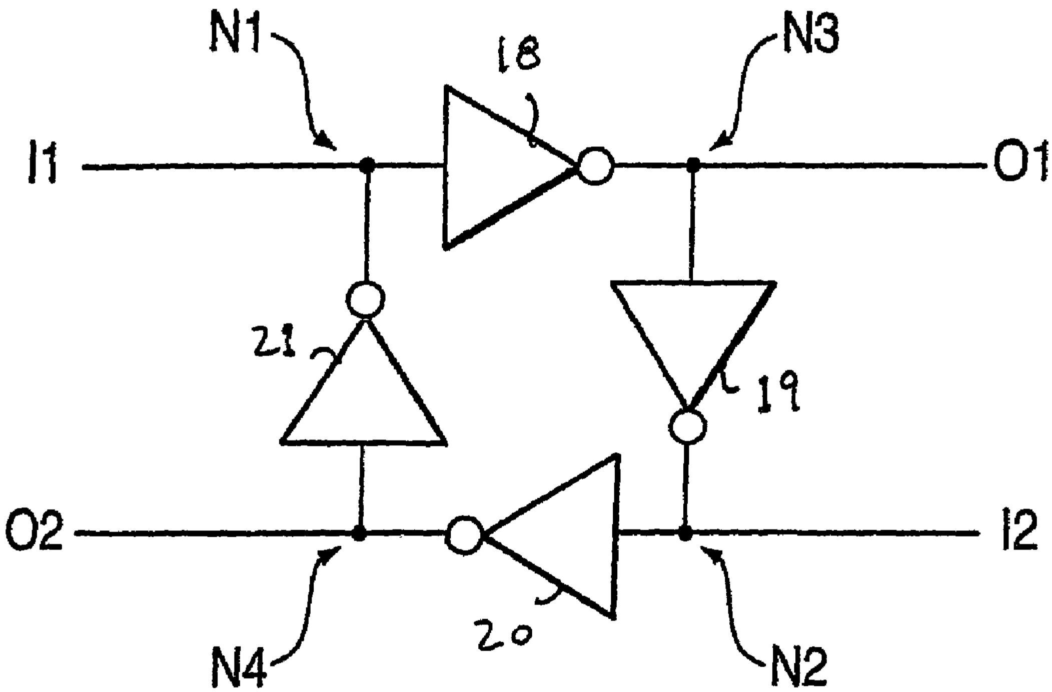
FIG. 5 is a diagram illustrating a latch circuit in accordance with a first embodiment of the present invention.

A first preferred embodiment of the present invention will now be described below with reference to FIGS. 5 and 6. FIG. 5 illustrates a latch circuit having two inputs I1,I2 and two outputs O1, O2. The first input I1 is connected to a first node N1, the second input I2 is connected to a second node N2, the first output O1 is connected to a third node N3 and the second output O2 is connected to a fourth node N4.

The first node N1 is the connecting point of an output of a fourth inverter 21 and an input of a first inverter 18. The second node N2 is the connecting point of the output of a second inverter 19 and the input of a third inverter 20. The third node N3 is the connecting point of the output of the first inverter 18 and the input of the second inverter 19. The fourth node N4 is the connecting point of the output of the third inverter 20 and the input of the fourth inverter 21.

As shown in FIG. 5, because the first input I1, the output of the fourth inverter 21 and input of the first inverter 18 are connected at the first node N1, the circuit elements which will become a load of the first input I1 include only the output of the fourth inverter 21 and the input of the first inverter 18.

In accordance with the first embodiment of the present invention, the number of circuit elements which will become a load for the input is reduced to two elements at the connecting point of the input of the latch circuit. Therefore, high-speed input operation of the latch circuit can be realized.

In accordance with the first embodiment of the present invention, the first input I1 and first output O1 are an input and an output, respectively, to be used during normal operation. The second input I2 and the second output O2 are an input and an output, respectively, to be used during the test operation. The first input I1 and first output O1 are required to realize high-speed input and output, and the second input I2 and second output O2 are not required to realize high-speed input and output. In accordance with the first embodiment of the present invention, the high-speed operation is realized during the usual operation of the latch circuit by realizing a high-speed input operation of the first input I1 which is required to realize high speed input.

The second input I2 is not required to realize the high-speed input operation described above. Therefore, the second input I2, which is not required to realize the high-speed operation, may be connected to the node N2.

Figure 6:
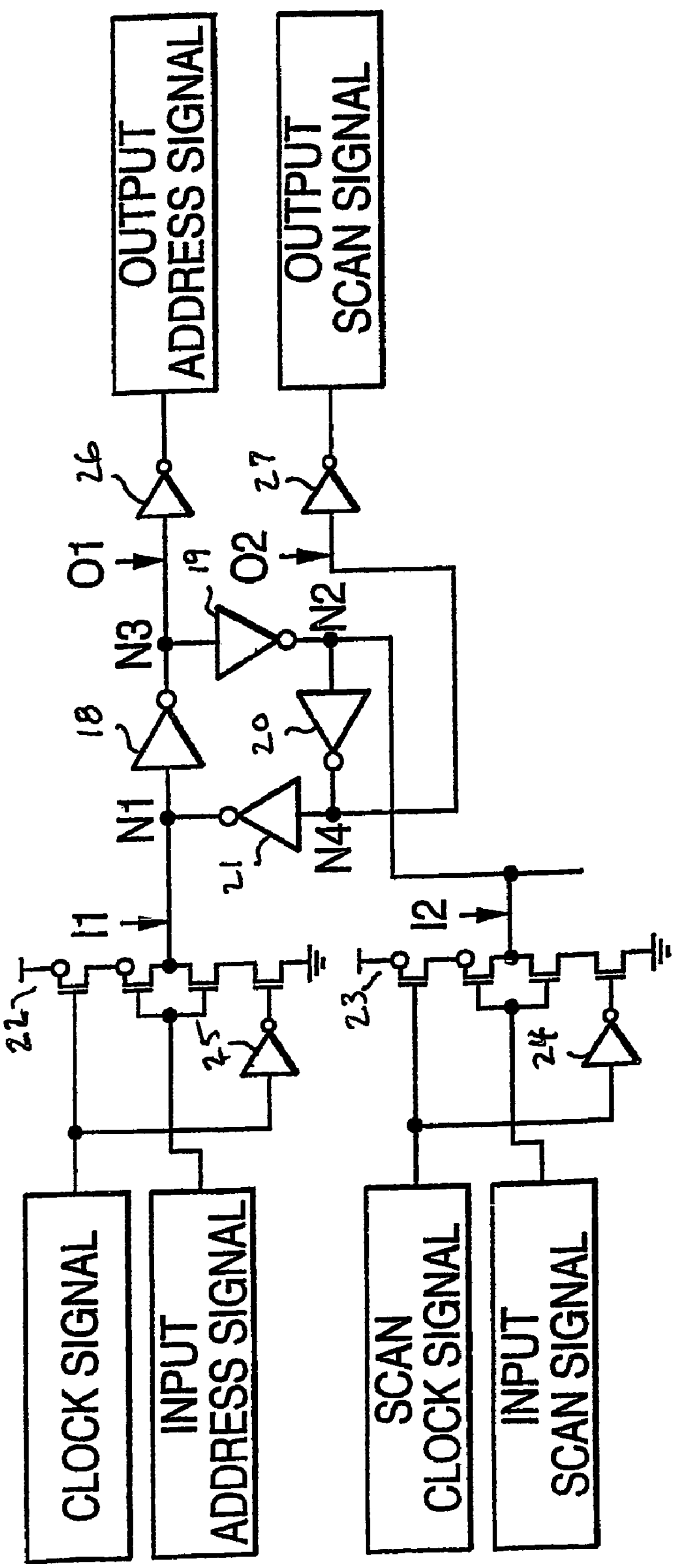
FIG. 6 is a detailed circuit diagram illustrating the latch circuit in accordance with the first embodiment of the present invention.

FIG. 6 is a detailed circuit diagram of the latch circuit shown in FIG. 5 adapted to the SRAM illustrated in FIG. 4A in accordance with embodiments of the present invention.

As shown in FIG. 6, the first input I1 is an input address signal, the second input I2 is an input scan signal, the first output O1 is an output address signal and the second output O2 is an output scan signal. The input address signal and a clock signal are supplied to the latch circuit via a switch circuit 22. The switch circuit 22 comprises two P-channel transistors and two N-channel transistors, which are connected in series, and is also connected to a high-voltage power source and a low-voltage power source.

The input scan signal and scan clock signal are supplied to the latch circuit via a switch circuit 23. In a manner similar to the switch circuit 22, the switch circuit 23 also comprises two P-channel transistors and two N-channel transistors, which are connected in series, and is also connected to the high-voltage power source and the low voltage power source.

During normal operating conditions, the scan clock signal is stopped. More specifically, a signal "1," which is the stop signal, is supplied as the scan clock signal and connection between the switch circuit 23 and high-voltage power source and low-voltage power source is separated. The signal "1" is supplied to the gate of one P-channel transistor, the signal "0" is supplied to the gate of one N-channel transistor via an inverter 24, and connection between the switch circuit 23 and high-voltage power source and low-voltage power source is separated. Therefore, the input scan signal and scan clock signal are not supplied to the latch circuit, but the input address signal and clock signal are supplied to the latch circuit.

During the test operation, the clock signal stops. That is, the "1" signal, which is the stop signal, is supplied as the clock signal and connection between the switch circuit 22 and high-voltage power source and low voltage power source is separated. More specifically, the signal "1" is supplied to the gate of one P-channel transistor, the signal "0" is supplied to the gate of one N-channel transistor via an inverter 25, and connection between the switch circuit 22 and high-voltage power source and low-voltage power source is separated. Therefore, the input address signal and clock signal are not supplied to the latch circuit, but the input scan signal and scan clock signal are supplied to the latch circuit.

The first output O1 of the latch circuit is output as the output address signal via an inverter 26, and the second output O2 of the latch circuit is output as the output scan signal via an inverter 27. The inverter 26 and inverter 27 operate as buffers. However, in the embodiment shown in FIG. 6, the inverter 26 and inverter 27 are not absolutely necessary, and the circuit can operate without these components.

A second preferred embodiment of the present invention will now be described below with reference to FIGS. 7 and 8.

Figure 7:
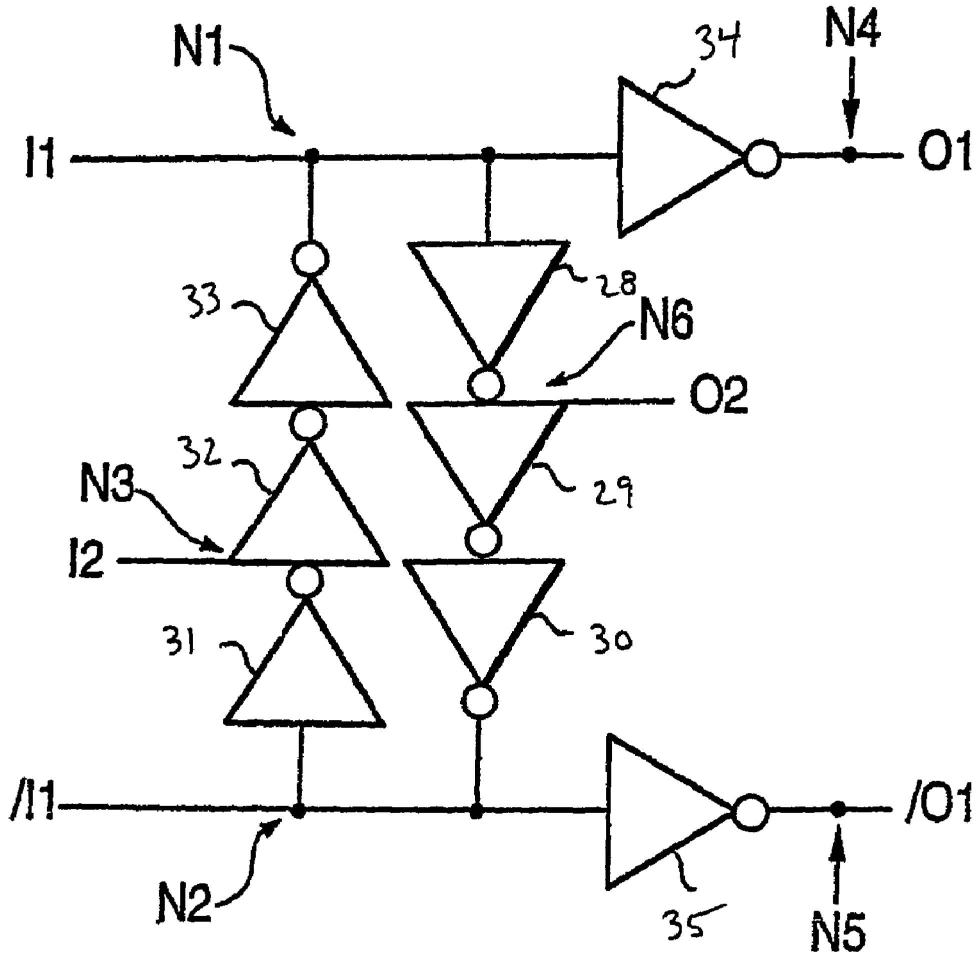
FIG. 7 is a diagram illustrating a latch circuit in accordance with a second embodiment of the present invention.

FIG. 7 illustrates a latch circuit including three inputs and three outputs in accordance with the second preferred embodiment of the present invention. As shown in FIG. 7, a first input I1 is connected to a first node N1; a second input /I1, which is a complementary input to the first input I1, is connected to a second node N2; a third input I2 is connected to a third node N3; a first output O1 is connected to a fourth node N4; a second output /O1, which is a complementary output to the first output O1, is connected to a fifth node N5; and a third output O2 is connected to a sixth node N6.

The first node N1 is the connecting point of the first input I1, the output of a sixth inverter 33, the input of a first inverter 28 and the input of a seventh inverter 34. The second node N2 is the connecting point of the second input /I1, the output of a third inverter 30, the input of a fourth inverter 31 and the input of an eighth inverter 35. The third node N3 is the connecting point of the third input I2, the output of the fourth inverter 31 and the input of a fifth inverter 32. The fourth node N4 is the connecting point of the first output O1 and the output of the seventh inverter 34. The fifth node N5 is the connecting point of the second output /O1 and the output of an eighth inverter 35. The sixth node N6 is the connecting point of the third output O2, the output of the first inverter 28 and the input of a second inverter 29.

Moreover, the output of the second inverter 29 is connected to the input of the third inverter 30, while the output of the fifth inverter 32 is connected to the input of the sixth inverter 33.

Because the first input I1, the output of sixth inverter 33, the input of the first inverter 28 and the input of the seventh inverter 34 are connected at the first node N1, the circuit elements which become a load for the first input I1 include only the output of the sixth inverter 33, the input of the first inverter 28 and the input of the seventh inverter 34.

Because the second input /I1, the output of the third inverter 30, the input of the fourth inverter 31 and the input of the eighth inverter 35 are connected at the second node N2, the circuit elements which become a load for the second input /I1 include only the output of the third inverter 30, the input of the fourth inverter 31 and the input of the eighth inverter 35.

In accordance with the second embodiment of the present invention, the number of circuit elements which become a load for the input at the connecting point of the input of the latch circuit are reduced to only three elements. Therefore, high-speed input operation of the latch circuit can be realized.

The first input I1, second input /I1, first output O1 and second output /O1 are assumed to be inputs and outputs used during ordinary operation. The third input I2 and third output O2 are assumed to be input and output, respectively, used in a test operation. The first input I1, second input /I1, the first output O1 and the second output /O1 are required to realize the high-speed input and output. The third input I2 and third output O2 are not required to realize high-speed input and output. In accordance with the second embodiment of the present invention, high-speed operation is realized during the normal operating condition of the latch circuit by realizing high-speed operation of the first input I1 and second input /I1 which require the high-speed operation.

In accordance with the second embodiment of the invention, the third input I2 does not require high-speed operation. However, in accordance with the second embodiment of the present invention, high-speed operation is realized for the third input I2.

Because the third input I2, the output of the fourth inverter 31 and the input of the fifth inverter 32 are connected at the third node N3, the circuit elements which become a load for the third input I2 include only of the output of the fourth inverter 31 and the input of the fifth inverter 32. According to the second embodiment of the present invention, the number of circuit elements which become a load for the test input is reduced to two elements at the connecting point of the test input of the latch circuit. Therefore, high-speed test operation of the latch circuit may be realized.

On the other hand, since the third input I2 is not required to realize high-speed operation, the other input which is not required to realize high-speed operation may be connected to the node to which the third input I2 is connected.

Figure 8:
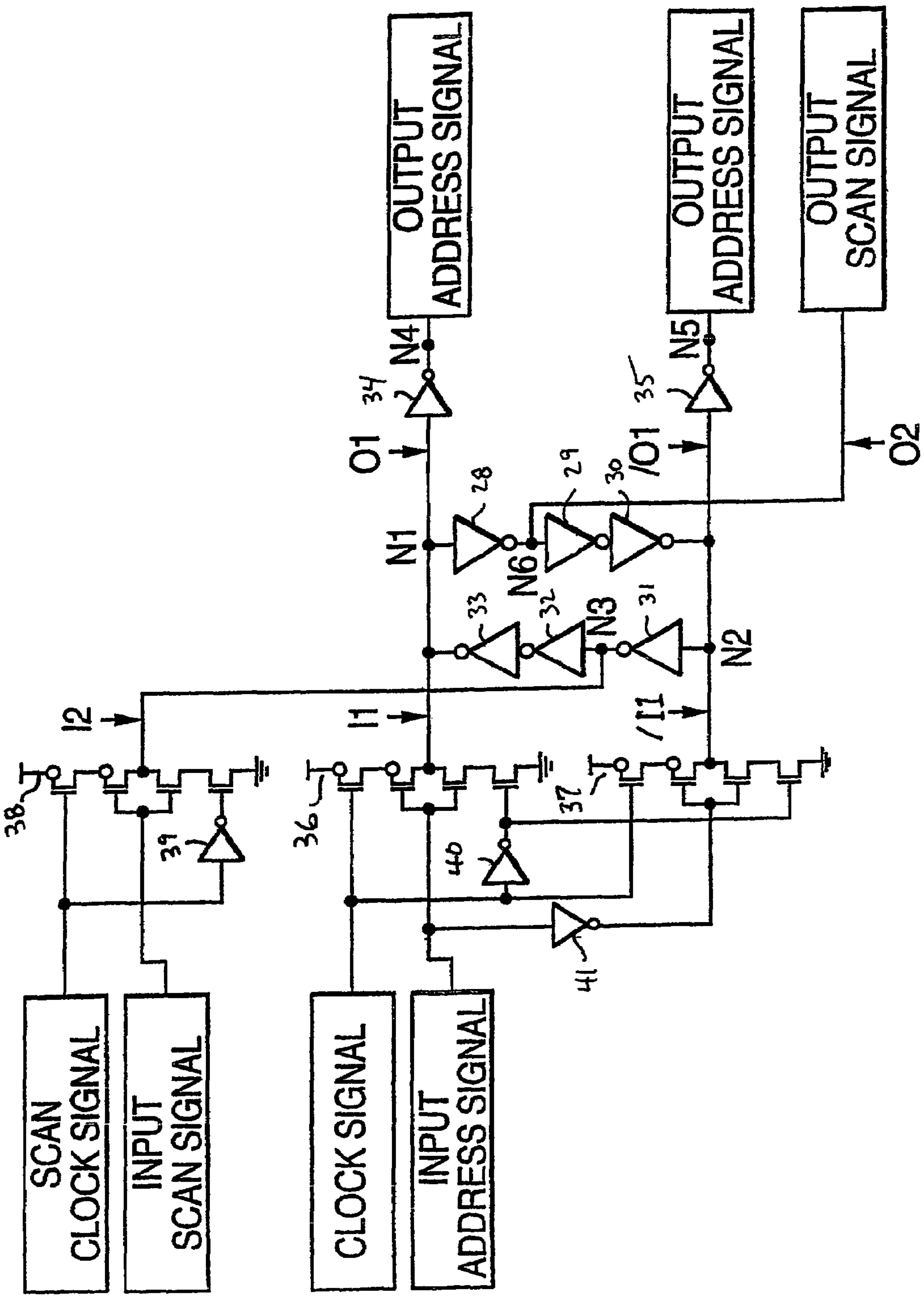
FIG. 8 is a detailed circuit diagram of the latch circuit in accordance with the second embodiment of the present invention.

FIG. 8 illustrates the latch circuit shown in FIG. 6 applied to the SRAM of FIG. 4A in accordance with the second embodiment of the present invention.

As shown in FIG. 8, a first input I1 is an input address signal; a second input /I1, which is the complement of the first input I1, is the complementary signal of the input address signal; a third input I2 is an input scan signal; a first output O1 is an output address signal; a second output /O1, which is the complement of the first output O1, is a complementary signal of the output address signal; and a third output O2 is an output scan signal.

The input address signal and clock signal are supplied to the latch circuit via a switch circuit 36. The switch circuit 36 comprises two P-channel transistors and two N-channel transistors connected in series, which are further connected to the high-voltage power source and low-voltage power source.

The complementary signal of the input address signal and clock signal are supplied to the latch circuit via a switch circuit 37. The switch circuit 37 is also formed of two P-channel transistors and two N-channel transistors connected in series, which are further connected to the high-voltage power source and low-voltage power source.

The input scan signal and scan clock signal are supplied to the latch circuit via a switch circuit 38. The switch circuit 38 is formed, in a manner similar to the switch circuit 36, of two P-channel transistors and two N-channel transistors connected in series, which are further connected to the high-voltage power source and low-voltage power source.

During the normal operation, the scan clock signal stops. That is, connection among the switch circuit 38, high-voltage power source and low-voltage power source is separated. More specifically, the signal "1" is supplied to the gate of one P-channel transistor, the signal "0" is supplied to the gate of one N-channel transistor via an inverter 39 and connection among the switch circuit 38, high-voltage power source and low-voltage power source is separated. Therefore, the input scan signal and scan clock signal are not supplied to the latch circuit, and the input address signal, a complementary signal of the input address signal and the clock signal are supplied to the latch circuit.

At the time of a test operation, the clock signal stops. That is, the signal "1," which is the stop signal, is supplied as the clock signal and connection among the switch circuit 36, high-voltage power source and low-voltage power source is separated. Specifically, the signal "1" is supplied to the gate of one P-channel transistor, the signal "0" is supplied to the gate of one N-channel transistor via an inverter 40 and connection among the switch circuit 36, high-voltage power source and low-voltage power source is separated. Moreover, the connection among the switch circuit 37, the high-voltage power source and the low voltage power source is separated in a similar manner. Accordingly, the input address signal, the complementary signal of the input address signal and the clock signal are not supplied to the latch circuit, but the input scan signal and scan clock signal are supplied thereto.

The first output O1 of the latch circuit is output as the output address signal via the inverter 34, and the second output /O1, which is the complement of the first output O1 of the latch circuit, is output as the complementary signal of the output address signal via the inverter 35. The inverter 34 and the inverter 35 operate as buffers. However, the inverters 34 and 35 are not required, and the embodiment of the invention shown in FIG. 8 operates without the inverter 34 and the inverter 35.

Figure 9:
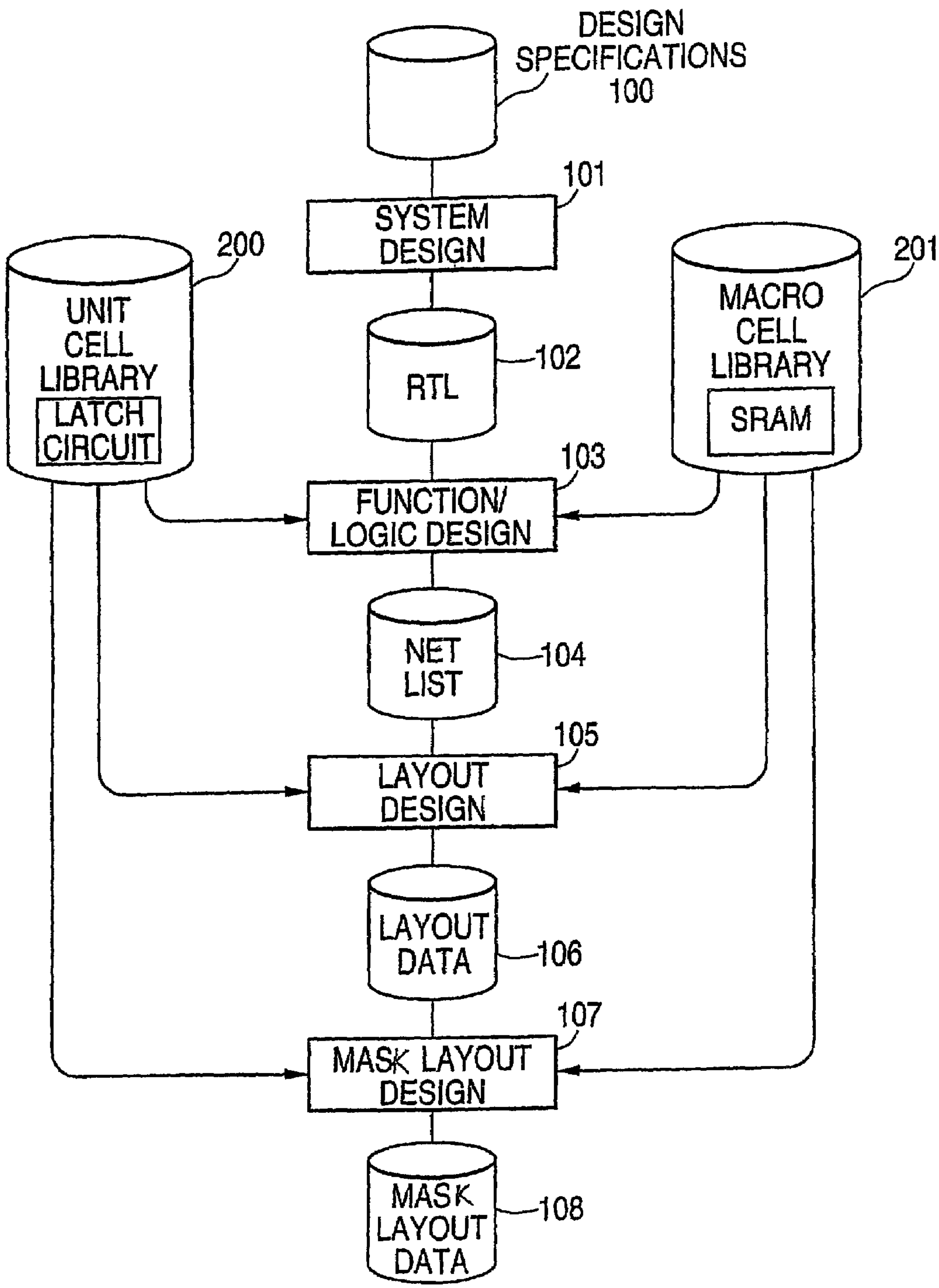
FIG. 9 is a block diagram of a system for designing a latch circuit in accordance with a third embodiment of the present invention.

A third embodiment of the invention will now be described below with reference to FIG. 9. FIG. 9 is a block diagram of a semiconductor chip design system to design a latch circuit in accordance with embodiments of the present invention.

As shown in FIG. 9, a latch circuit, such as the latch circuit shown in FIGS. 5–8, is registered to a unit cell library 200. Moreover, a memory (SRAM, DRAM or the like) using the latch circuit shown in FIGS. 5–8 is registered to a macro cell library 201. The unit cell library 200 and macro cell library 201 are used in the semiconductor design system.

As shown in FIG. 9, a system design system 101 generates a register transfer level (RTL) description (operation level logic circuit) 102 based on a semiconductor design specification 100. A function/logic design system 103 generates a net list (i.e., a gate level logic circuit) based on the RTL description 102. In practice, the RTL description 102 is converted to the net list 104 through logical synthesis. A layout design system 105 generates layout data 106 based on the net list 104. A mask layout design system 107 generates mask layout data 108 based on the layout data 106. A semiconductor chip is then manufactured based on the mask layout data 108.

The unit cell library 200, to which the latch circuit is registered, or the macro cell library 201, to which the memory (e.g., SRAM) using the latch circuit of the present invention is registered, is used in the function/logic design system 103 to generate the net list 104 including the latch circuits shown in FIGS. 5–8.

Moreover, the unit cell library 200, to which the latch circuits shown in FIGS. 5–8 are registered, and/or the macro cell library 201, to which the memory using the latch circuits shown in FIGS. 5–8 is registered, is used in the layout design system 105 to generate the layout data 106 including the latch circuit of the present invention.

Furthermore, the unit cell library 200 and/or the macro cell library 201 is used in the mask layout design system 107 to generate the mask layout data 108 including the latch circuits shown in FIGS. 5–8.

In accordance with embodiments of the present invention described hereinabove, a semiconductor chip including a latch circuit is generated by utilizing the unit cell library 200 to which the latch circuit of the present invention is registered and/or the macro cell library 201 to which the memory using the latch circuit of the present invention is registered.

Although preferred embodiments of the present invention have been shown and described, it will be appreciated by those skilled in the art that changes may be made in these embodiments without departing from the principle and spirit of the invention, the scope of which is defined in the appended claims and their equivalents.

What is claimed is:

1. A latch circuit comprising:

four or more inverters connected consecutively, one after another, with a single loop node connecting each pair of adjacent inverters to hold a signal such that at least four inverters are in series in a single loop; and a plurality of different input terminals directly connected respectively to different loop nodes, wherein at least one input terminal is used for normal operation of the latch circuit, and at least another different input terminal is used for a test operation of the latch circuit.

2. A latch circuit comprising:

four or more inverters connected consecutively, one after another, with a single loop node connecting each pair of adjacent inverters to hold a signal such that at least four inverters are in series in a single loop; and a plurality of different input terminals and output terminals directly connected respectively to different loop nodes, wherein at least one input terminal is used for normal operation of the latch circuit, and at least another different input terminal is used for a test operation of the latch circuit.

3. A latch circuit comprising:

four or more inverters connected consecutively, one after another, with a single loop node connecting each pair of adjacent inverters to hold a signal such that at least four inverters are in series in a single loop; and a plurality of different output terminals directly connected respectively to different loop nodes, wherein at least one output terminal is used for normal operation of the latch circuit, and at least another different output terminal is used for a test operation of the latch circuit.

4. A latch circuit comprising:

four or more inverters connected consecutively, one after another, with a single loop node connecting each pair of adjacent inverters to hold a signal such that at least four inverters are in series in a single loop; and a plurality of different input terminals and output terminals directly connected respectively to different loop nodes, wherein at least one output terminal is used for normal operation of the latch circuit, and at least another different output terminal is used for a test operation of the latch circuit.

5. A latch circuit, comprising:

a first inverter including an input and an output;

a second inverter including an input and an output, the output of the first inverter being connected directly to the input of the second inverter at a first node;

a third inverter including an input and an output, the output of the second inverter being connected directly to the input of the third inverter at a second node; and a fourth inverter including an input and an output, the output of the third inverter being connected directly to the input of the fourth inverter at a third node, wherein the output of the fourth inverter is connected directly to the input of the first inverter at a fourth node, and wherein a first input is connected at the fourth node, a second input is connected at the second node, a first output is connected at the first node and a second output is connected at the third node.

6. A latch circuit as recited in claim 5, wherein the first input and the first output are used during normal operation of the latch circuit, and the second input and the second output are used during a test operation of the latch circuit.

7. A latch circuit as recited in claim 5, wherein the first input is an input address signal, the second input is an input scan signal, the first output is an output address signal and the second output is an output scan signal.

8. A latch circuit, comprising:

a first inverter including an input and an output;

a second inverter including an input and an output, the output of the first inverter being connected to the input of the second inverter;

a third inverter including an input and an output, the output of the second inverter being connected to the input of the third inverter;

a fourth inverter including an input and an output, the output of the third inverter being connected to the input of the fourth inverter at a first node;

a fifth inverter including an input and an output, the output of the fourth inverter being connected to the input of the fifth inverter; and a sixth inverter including an input and an output, the output of the fifth inverter being connected to the input of the sixth inverter and the output of the sixth inverter being connected to the input of the first inverter at a second node, wherein a first input is connected at the second node, a second input is connected at the first node, a third input is connected at a node between the first node and the second node, a first output is connected at the second node, a second output is connected at the first node and a third output is connected between the first node and the second node.

9. A latch circuit as recited in claim 8, wherein the first input, the second input, the first output and the second output are used during normal operation of the latch circuit, and the third input and third output are used during a test operation of the latch circuit.

10. A latch circuit as recited in claim 8, wherein the first input is an input address signal, the second input is a complement signal of the first input, the third input is an input scan signal, the first output is an output address signal, the second output is a complement of the first output and the third output is an output scan signal.

11. A latch circuit, comprising:

a first inverter including an input and an output;

a second inverter including an input and an output, the output of the first inverter being connected to the input of the second inverter;

a third inverter including an input and an output, the output of the second inverter being connected to the input of the third inverter;

a fourth inverter including an input and an output, the output of the third inverter being connected to the input of the fourth inverter at a first node;

a fifth inverter including an input and an output, the output of the fourth inverter being connected to the input of the fifth inverter; and a sixth inverter including an input and an output, the output of the fifth inverter being connected to the input of the sixth inverter, the output of the sixth inverted being connected to the input of the first inverter at a second node; and wherein a first input is connected at the second node, a second input is connected at the first node, a third input is connected at a node excluding the first node and the second node, a first output is connected at the second node, a second output is connected at the first node and a third output is connected at another node excluding the first node and the second node.

* * * * *

UNITED STATES PATENT AND TRADEMARK OFFICE

CERTIFICATE OF CORRECTION

PATENT NO. : 6,975,151 B2
APPLICATION NO. : 10/056072
DATED : December 13, 2005
INVENTOR(S) : Hideo Akiyoshi It is certified that error appears in the above-identified patent and that said Letters Patent is hereby corrected as shown below:

On the Title page, in the title (54), after “LOAD”, insert --,--.

Column 1,in the title, “LOAD”, insert --,--.

Column 12, line 17, change “inverted” to --inverter--.

Signed and Sealed this

Fifteenth Day of August, 2006

JON W. DUDAS
*Director of the United States Patent and Trademark Office*